(12) United States Patent
Wu et al.

(10) Patent No.: US 7,361,582 B2
(45) Date of Patent: Apr. 22, 2008

(54) METHOD OF FORMING A DAMASCENE STRUCTURE WITH INTEGRATED PLANAR DIELECTRIC LAYERS

(75) Inventors: Tom Wu, Phoenix, AZ (US); Sasson Somekh, Los Altos Hills, CA (US); Chien Chiang, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/670,720

(22) Filed: Feb. 2, 2007

(65) Prior Publication Data

US 2007/0123033 A1 May 31, 2007

Related U.S. Application Data

(62) Division of application No. 10/942,302, filed on Sep. 15, 2004, now Pat. No. 7,229,907.

(51) Int. Cl.
*H01L 21/44* (2006.01)

(52) U.S. Cl. ............... 438/618; 438/678; 257/E21.575

(58) Field of Classification Search ............... 438/618, 438/678

See application file for complete search history.

(56) References Cited

U.S. PATENT DOCUMENTS

| | | | |
|---|---|---|---|
| 6,176,992 | B1 | 1/2001 | Talieh |
| 6,572,755 | B2 | 6/2003 | Emesh et al. |
| 2002/0108861 | A1 | 8/2002 | Emesh et al. |
| 2002/0146908 | A1 | 10/2002 | Chadda et al. |
| 2003/0132120 | A1* | 7/2003 | Emesh et al. ............... 205/117 |
| 2003/0134576 | A1 | 7/2003 | Chadda et al. |

OTHER PUBLICATIONS

Kondo et al (Complete Abrasive Free Process for Copper Damascene Interconnection, pp. 253-255, IEEE 200.*
Kondo, et al., "Complete-Abrasive-Free Process for Copper Damascene Interconnection;" IEEE 2000; pp. 253-255; Central Research Laboratory, Hitachi, Ltd.; Tokyo, Japan.
Yamaguchi, et al., "A 7 Level Metallization with Cu Damascene Process Using Newly Developed Abrasive Free Polishing;" IEEE 2000; pp. 264-266, Device Development Center, Hitachi, Ltd.; Tokyo, Japan.
Li, et al., "A Low Cost and Residue-Free Abrasive-Free Copper CMP Process With Low Dishing, Erosion and Oxide Loss;" IEEE 2001; pp. 137-139; CMP Business Group, Applied Materials; Santa Clara, California, USA.

* cited by examiner

*Primary Examiner*—Alexander G Ghyka
(74) *Attorney, Agent, or Firm*—Ingrassia Fisher & Lorenz, P.C.

(57) ABSTRACT

Methods are provided for forming a circuit component on a workpiece substrate. The methods comprise the steps of depositing a dielectric material over the substrate; etching a pattern through the dielectric material to expose a portion of the substrate; depositing a barrier metal over the dielectric material and the exposed portion of the substrate; depositing a conductive metal over the barrier metal, the deposited conductive metal having a thickness sufficient to fill the etched pattern; planarizing the conductive metal to form a planar metal layer; and polishing the metal layer and the barrier metal in a single polishing step using an abrasive-free polish until the dielectric material surrounding the pattern is exposed.

10 Claims, 4 Drawing Sheets

METHOD OF FORMING A DAMASCENE STRUCTURE WITH INTEGRATED PLANAR DIELECTRIC LAYERS

CROSS-REFERENCES TO RELATED APPLICATIONS

This is a division of application Ser. No. 10/942,302, filed Sep. 15, 2004 now U.S. Pat. No. 7,229,907.

TECHNICAL FIELD

The present invention generally relates to damascene structures that are part of a workpiece such as a semiconductor wafer, and more particularly relates to methods for forming and polishing damascene structures in a manner that produces planar layers.

BACKGROUND

Chemical mechanical polishing (CMP) is one technique which has been conventionally used for semiconductor wafer planarization. For example, see U.S. Pat. No. 5,099,614, issued in March in 1992 to Riarai et al.; U.S. Pat. No. 5,329,732 issued July 1994 to Karlsrud et al., and U.S. Pat. No. 5,498,199 issued March 1966 to Karlsrud et al. A typical CMP apparatus suitable for planarizing a semiconductor surface generally includes a wafer carrier configured to support, guide, and apply pressure to a wafer during the polishing process, a polishing compound such as a slurry to assist in wafer surface material removal, and a polishing surface such as a polishing pad. In addition, the polishing apparatus may include an integrated wafer cleaning system and/or an automated load/unload station to facilitate automatic processing of the wafers.

A wafer surface is generally polished by moving the wafer to be polished relative to the polishing surface in the presence of a polishing compound. In particular, the wafer is placed in a carrier such that the surface to be polished is placed in contact with the polishing surface, and the polishing surface and the wafer are moved relative to each other while slurry is supplied to the polishing surface.

Furthermore, CMP is often applied when forming microelectronic devices to provide a substantially smooth, planar surface suitable for subsequent fabrication processes such as photoresist coating and pattern definition. For example, a conductive feature such as a metal line, conductive plug, or the like may be formed on a wafer surface by forming trench lines and vias on the wafer surface, depositing conductive material over the wafer surface and into the trenches and vias, and removing the conductive material on the wafer surface using a CMP process, leaving the vias and trenches filled with conductive material. The conductive features often include a barrier material to reduce unwanted conductive material diffusion and to promote adhesion between the conductive material and any adjacent layer in the circuit.

Aluminum is often used to form conductive features because its characteristics are compatible with conventional deposition (e.g. chemical vapor deposition) and etch (e.g., reactive ion etch) techniques. Although using aluminum to form conductive features is adequate in some cases, forming aluminum conductive features becomes increasingly problematic as the size of the conductive feature decreases. In particular, as the conductive feature decreases in size, the current density through the feature generally increases, and thus the feature becomes increasingly susceptible to electromigration, i.e., the mass transport of metal due to the current flow. Electromigration may cause short circuits where the metal accumulates, open circuits where the metal has been depleted, and/or other circuit failures. Similarly, increased conductive feature resistance may cause unwanted device problems such as access power consumption and heat generation.

Recently, techniques utilizing copper to form conductive features have been developed because copper is less susceptible to electromigration and exhibits a lower resistivity than aluminum. Since copper does not readily form volatile or soluble compounds, the copper conductive features are often formed using a damascene process. More particularly, the copper conductive features are formed by creating a via within an insulating material, depositing a barrier layer onto the insulating material surface and into the via, depositing a seed layer of copper into the barrier layer, electrodepositing a copper layer onto the seed layer to fill the via, and removing any excess barrier metal and copper from the insulating material surface using chemical and mechanical polishing. During the electrodeposition process, additives such as leveling agents may be added to the plating bath to reduce the formation of voids within the conductive features.

As stated previously, a CMP machine typically includes a wafer carrier configured to hold, rotate, and transport a wafer during the process of polishing or planarizing the wafer. During the planarizing operation, a pressure applying element (e.g., a rigid plate, a bladder assembly, or the like) that may be an integral part of the wafer carrier applies pressure such that the wafer engages a polishing surface with a desired amount of force. The carrier and the polishing surface are rotated, typically at different rotational velocities, to cause relative lateral motion between the polishing surface and the wafer and to promote uniformed planarization. The polishing surface generally comprises a horizontal polishing pad that may be formed of various materials such as blown polyurethane and are available commercially from, for example, Rodel Inc. located in Phoenix, Ariz. Abrasive slurry may also be applied to the polishing surface which acts to chemically weaken the molecular bonds at the wafer surface so that the mechanical action of the polishing pad and slurry abrasive can remove the undesirable material from the wafer surface.

Unfortunately, the CMP process tends to leave stresses in the workpiece leading to subsequent cracking and shorting between metal layers. Furthermore, the CMP process may result in sheering or crushing of fragile layers. The CMP process also has a tendency to cause dishing in the center of wide metal features, such as trenches and vias, oxide erosion between metal features, and dielectric oxide loss.

For example, a conventional manufacturing process for a dual damascene structure includes a step of polishing a low dielectric constant material (i.e., k<2.6) to create a planar surface in preparation of a copper layer deposition. Planarizing the low dielectric constant material is necessary because the low dielectric constant material is deposited atop an underlying metal surface that generally has undulations resulting from a prior CMP polishing step, and the low dielectric constant material conforms to the underlying surface topography.

After the low dielectric constant material is polished, a copper layer is deposited into a via extending therethrough, and copper also naturally forms as a layer atop the low dielectric constant material. Using a CMP process, the copper layer is removed, leaving the low dielectric constant material and an exposed copper surface inside the via. The exposed copper typically has a dished surface following the CMP process. Consequently, the low dielectric constant material typically must be subjected to additional polishing after the copper CMP process. Polishing the low dielectric constant material is problematic. The dielectric material is typically both porous and fragile, and as a result is vulnerable to losing dielectric properties if water, water vapor, or other relatively high dielectric constant materials are entrained or adsorbed to the porous dielectric surface. Since many polishing slurries are aqueous or have a relatively high dielectric constant, it is difficult to polish without deteriorating the low dielectric constant material's dielectric properties. One way to avoid damaging the low dielectric constant material is to deposit a capping layer above the low dielectric constant material. The capping layer enables the dielectric stack to withstand friction at sustained temperatures as high as 400° C. A thin silicon carbide (SiC) material containing hydrogen is particularly effective as the capping layer. SiC has a dielectric constant between 4.5 and 7.5. Another way to avoid overstressing the material is to polish the exposed copper surface within the via at very low pad pressures and moderate sheer rates. However, both of these preventive measures increase polish time and decrease tool throughput.

One alternative to CMP for minimizing surface topography for a low dielectric constant layer is the use of an abrasive-free polish (AFP) slurry to polish the underlying copper layer surface before depositing a dielectric material thereon. Polishing copper using an AFP slurry is a particularly effective way to minimize dishing, and consequently minimizes or eliminates corrective dielectric polishing following the copper polishing. An AFP slurry effectively planarizes the copper surface when the topography is already relatively flat and if there is not a large copper overburden or field area thickness. However, not all copper deposition processes result in a suitably flat copper surface or a sufficiently thin copper layer for the AFP slurry to be effective or efficient.

Electrochemical planarization, also known as electropolishing, is another attractive alternative to CMP because it does not impart significant mechanical stresses to the workpiece, and consequently does not significantly reduce the integrity of the devices. Furthermore, electrochemical planarization is less likely to cause metal dishing, oxide erosion, and oxide loss of the dielectric layer.

Electrochemical planarization is based on electroetching and electrochemical machining, that is, the removal of a thin layer of metal from a substrate through the action of an electrical solution and electricity. For example, if two electrodes, an anode and a cathode are immersed in a liquid electrolyte and are wired to permit a potential difference between the electrodes, metal atoms in the anode are ionized by the electricity and go into the solution as ions. Depending on the chemistry of the metals and salt, the metal ions from the anode tend to either plate the cathodes, fall out as precipitate, or remain in solution. Unfortunately, using conventional electrochemical planarization techniques, etching selectivity is reduced in areas on the wafer having varying high or low topographies, and uniform planarization is not achieved. The same is largely true when a polish pad is used in conjunction with an electrochemical planarization process, in which case the process is referred to as electrochemical mechanical planarization, or ECMP.

Accordingly, it is desirable to overcome some of the difficulties associated with forming a damascene structure, particularly one that includes an interlayer dielectric structure with multiple dielectric layers. Particularly, it is desirable to overcome problems related to surface topography on a metallization or dielectric layer due to uneven layer deposition, and to overcome associated difficulties in planarizing low dielectric constant materials formed around or above the metallization layer. Furthermore, other desirable features and characteristics of the present invention will become apparent from the subsequent detailed description and the appended claims, taken in conjunction with the accompanying drawings and the foregoing technical field and background.

BRIEF SUMMARY

According to one embodiment of the invention, a method is provided for forming a circuit component on a workpiece substrate. The method comprises the steps of depositing a dielectric material over the substrate; etching a pattern through the dielectric material to expose a portion of the substrate; depositing a barrier metal over the dielectric material and the exposed portion of the substrate; depositing a conductive metal over the barrier metal, the deposited conductive metal having a thickness sufficient to fill the etched pattern; planarizing the conductive metal to form a planar metal layer; and polishing the metal layer and the barrier metal in a single polishing step using an abrasive-free polish until the dielectric material surrounding the pattern is exposed.

According to another embodiment of the invention, a method is provided for forming a multiple-layer structure on a workpiece with a circuit component extending through the structure. The method comprises a step of forming a first layer of the circuit component by a) depositing a dielectric material onto the workpiece; b) etching a pattern through the dielectric material to expose a surface beneath the dielectric material; c) depositing a barrier metal over the dielectric material and the exposed surface; d) depositing a conductive metal over the barrier metal, the deposited conductive metal having a thickness sufficient to fill the etched pattern; e) planarizing the conductive metal to form a planar metal layer; and f) polishing the metal layer and the barrier metal in a single polishing step using an abrasive-free polish until the dielectric material surrounding the filled pattern is exposed. The method further comprises the step of forming a plurality of additional layers over the first layer by repeating steps a) through f) to produce the multiple-layer structure with the circuit component formed of connected filled patterns from each of the multiple layers.

According to another embodiment of the invention, another method is provided for forming a multiple-layer structure on a workpiece with a circuit component extending through the structure. The method comprises the steps of depositing a first dielectric material having a dielectric constant greater than about 2.6 onto the workpiece; planarizing the first dielectric material; depositing a second dielectric material having a dielectric constant less than about 2.6 over the first dielectric material; etching a pattern through the first and second dielectric materials to expose a surface beneath the first dielectric material; depositing a barrier metal over exposed areas of the first and second dielectric material and over the exposed surface; depositing a conductive metal over the barrier metal, the deposited conductive metal having a thickness sufficient to fill the etched pattern; planarizing the conductive metal to form a planar metal layer; and polishing the metal layer and the barrier metal in a single polishing step using an abrasive-free polish until the second dielectric material surrounding the filled pattern is exposed, and stopping the polishing step before the second dielectric material is polished.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The present invention overcomes some of the difficulties associated with forming an interlayer dielectric structure with multiple planar dielectric layers. For example, the invention overcomes problems related to surface topography on a metallization or dielectric layer due to uneven layer deposition, and also overcomes difficulties in planarizing low dielectric constant materials. The solution to these difficulties lies in an inventive integrated process that combines metallization layer planarization and polishing to produce a structure having metal embedded in a low dielectric constant material with a barrier metal on the structure's exposed working surface. The process can be supplemented with a simplified barrier removal process that does not necessarily require depositing a conventional capping layer onto the low dielectric constant material, and further avoids potential damage to the low dielectric constant material that can be caused by overpolishing the metallization or barrier layers. The process can be further supplemented by a step that includes adding a hard dielectric layer to the structure as necessary to provide an easily polished surface and thereby avoid any polishing on the low dielectric constant material.

Figure 1:
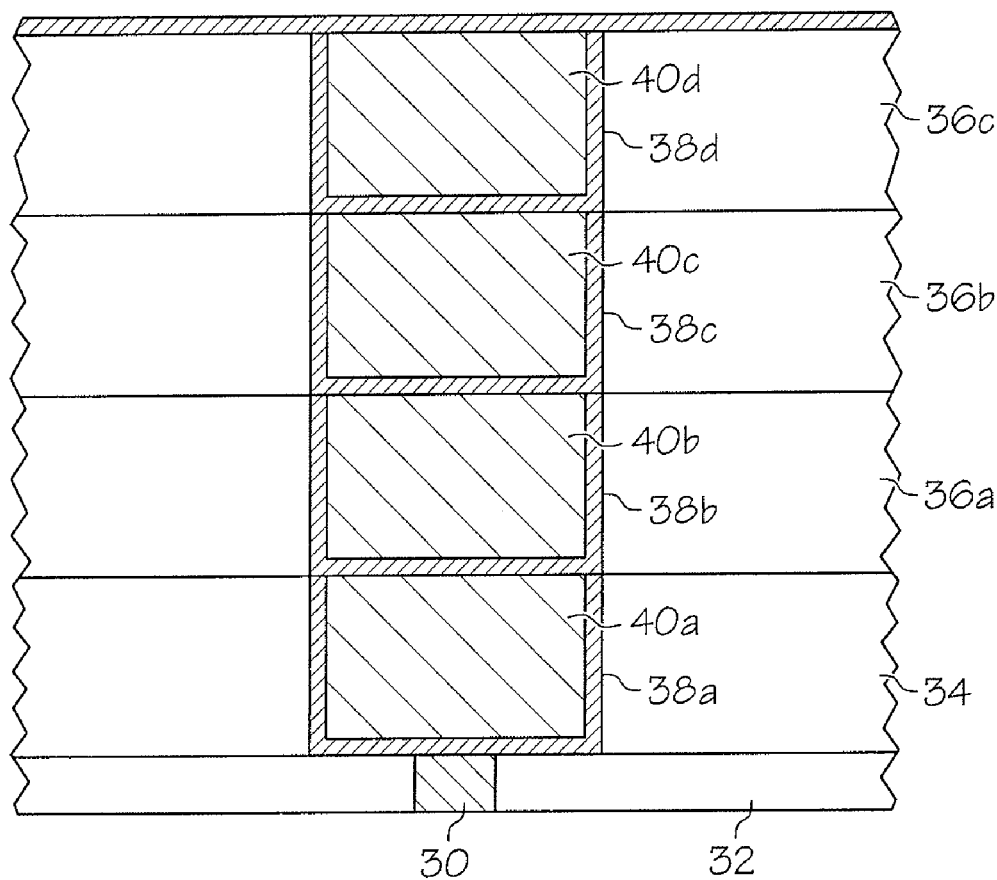
FIG. 1 is a cross-sectional view of an interconnection formed using an exemplary process according to the present invention.

An exemplary damascene structure prepared by the process of the present invention is illustrated in FIG. 1 which is a cross-sectional view of an interconnection formed using an exemplary process according to the present invention. The interconnection structure is formed on a substrate 32 having a region 30 on which the interconnection is to be formed, and includes multiple metallization layers 40a-d with barrier metal 38a-d at least partially surrounding the metallization layers 40a-d. The metallization layers 40a-d are formed through respective dielectric layers 34, 36a-c. Although the interconnection structure is illustrated as four-layered, it is understood that the number of layers is not a limiting feature of the invention, and the process of the present invention can be utilized to produce an interconnection structure or other circuit pattern having fewer or many more metallization layers than four. The interconnection structure or other circuit pattern, and the method of manufacturing the same will be described in detail below.

Figure 2:
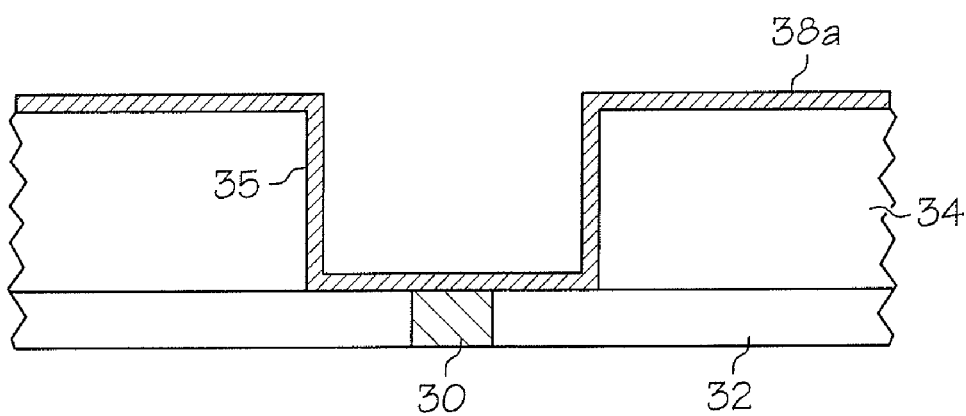
FIGS. 2 to 4 are cross-sectional views illustrating a process for forming the interconnection depicted in FIG. 1.

FIG. 2 illustrates a single dielectric layer 34 that is deposited onto the substrate 32 over the region 30. The various materials and properties for the dielectric layer 34 will be described in detail below. The dielectric layer 34 can be deposited using a plasma enhanced chemical vapor deposition process, a spin coating process, or other conventional process suitable for forming a layer from a particular dielectric material. A via or trench line 35 is etched through the dielectric layer 34 to expose the circuit component 30, and the barrier metal 38a is deposited over the exposed surfaces including the substrate 32, the circuit component 30, and the dielectric layer 34. Exemplary barrier metals include titanium (Ti), titanium nitride (TiN), tantalum (Ta), tantalum nitride (TaN), and other conventional barrier metal compounds. The barrier metal 38a is approximately 50 Å in thickness, although the barrier metal 38a can be thinner or thicker as necessary.

Figure 3A:
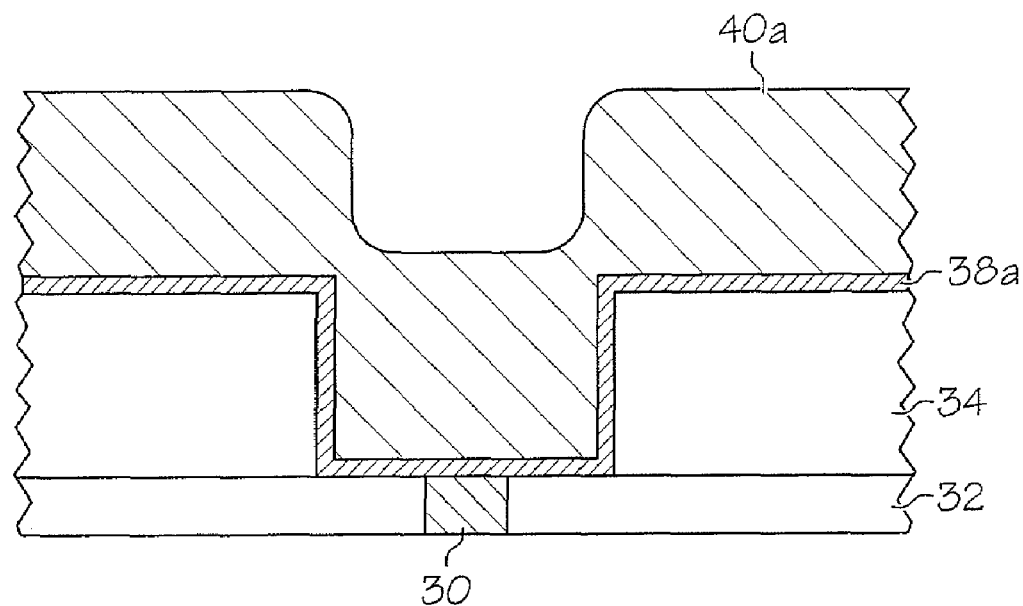
Figure 3B:
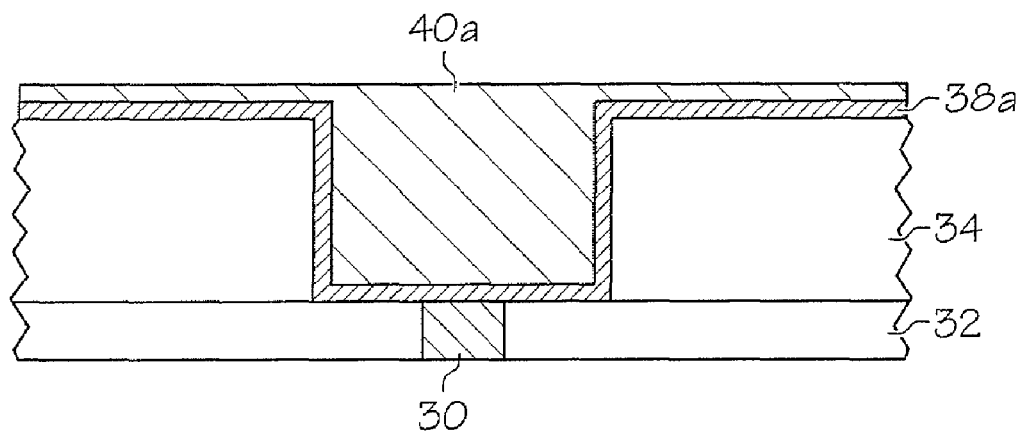

FIG. 3(a) illustrates a metallization layer 40a conformally deposited over the barrier metal 38a, and FIG. 3(b) illustrates the metallization layer 40a deposited over the barrier metal 38a using a planar plating process described in detail below. Either process for depositing the metallization layer 40a is within the scope of the present invention, and is preliminary to the structure of FIG. 4 which illustrates the completed interconnection layer after polishing the metallization layer 40a and the barrier metal 38a.

Figure 5:
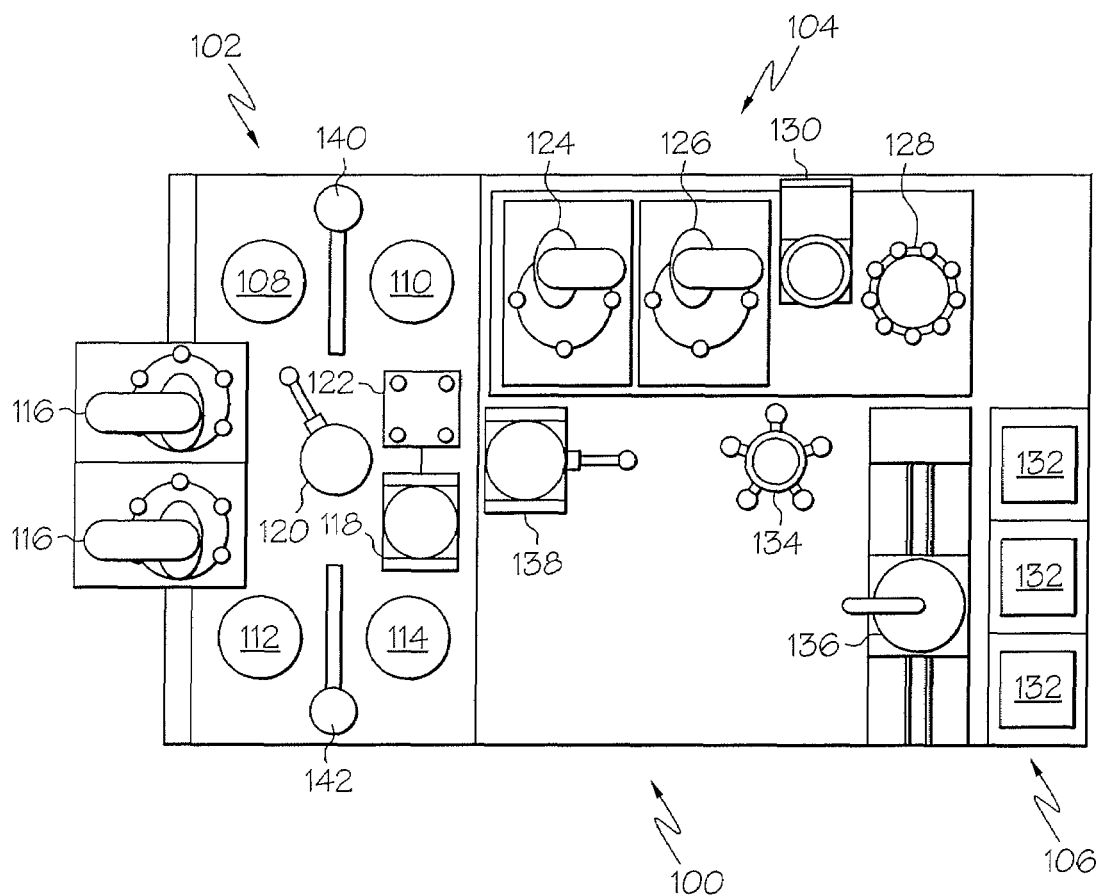
FIG. 5 is a top cutaway view of a polishing system in accordance with the present invention.

In an exemplary embodiment, each of the metallization layers 40a-d is copper. Each of the metallization layers 40a-d is preferably deposited and polished using an apparatus that is suitable for chemically, mechanically, and/or electrochemically depositing conductive material onto a workpiece surface, and also is suitable for planarizing the conductive material. FIG. 5 illustrates a top cutaway view of one such suitable polishing apparatus 100 in accordance with the present invention. The apparatus 100 includes a multi-station polishing system 102, a clean system 104, and a wafer load/unload station 106. In addition, the apparatus 100 includes a cover (not shown) that surrounds the apparatus 100 to isolate the apparatus 100 from the surrounding environment. In accordance with a preferred embodiment in the present invention, the apparatus 100 is a CMP machine available from Novellus Systems Inc. of San Jose, Calif. However, the apparatus 100 may be any machine capable of removing or depositing material from or onto a workpiece surface.

Although the apparatus 100 and other machines described below may be used to remove material or deposit material on the surface of a variety of workpieces such as magnetic disks, optical disks, and the like, the machines are conveniently described below in connection with removing and depositing material on the surface of a wafer. In the context of the present invention, the term "wafer" shall mean semiconductor substrates, which may include layers of insulating, semiconductor, and conducting layers or features formed thereon and used to manufacture microelectronic devices.

An exemplary polishing station 102 includes four independently operating polishing stations 108, 110, 112, and 114; a buff station 116; a stage 118; a robot 120; and optionally, a metrology station 122. The polishing stations 108-114 may be configured as desired to perform specific functions. In accordance with the present invention, at least one of the stations 108-114 includes an electrochemical deposition and polishing apparatus as described herein. Another one of the stations 108-114 includes an electrochemical planarization apparatus as described herein, and the remaining stations may be configured for traditional chemical mechanical polishing or the like.

The polishing system 102 also includes polishing surface conditioners 140 and 142. The surface conditioner configuration generally depends on the type of polishing surface to be conditioned. For example, when the polishing surface comprises a polyurethane polishing pad, the conditioners 140 and 142 may include a rigid substrate coated with diamond material. Various other surface conditioners may also be used in accordance with the present invention.

The clean system 104 is generally configured to remove debris such as slurry residue and material from the wafer surface during polishing. In accordance with the illustrated embodiment, the clean system 104 includes clean stations 124, 126, a spin rinse dryer 128, and a robot 130 configured to transport the wafer between the clean stations 124, 126 and spin rinse dryer 128. Alternatively, the clean station 104 may be separate from the remainder of the electrochemical deposition and planarization apparatus. In this case, the load station 106 is configured to receive dry wafers for processing, but the wafers may remain in a wet (e.g., deionized water) environment until the wafers are transferred to the clean station. In operation, cassettes 132, including one or more wafers, are loaded onto the apparatus 100 at the station 106. The wafers are then individually transported to a stage 134 using a dry robot 136. A wet robot 138 retrieves a wafer at the stage 132 and transports the wafer to the metrology station 122 for film characterization or to the stage 118 within the polishing system 102. The robot 120 picks up the wafer from the metrology station 122 or the stage 118 and transports the wafer to one of the polishing stations 108-114 for electrochemical deposition or planarization of a conductive material. After a desired amount of material has been deposited or removed, the wafer may be transported to another polishing station. Alternatively, as will be more fully discussed below, a polishing environment within one of the stations may be changed from an environment suitable for the electrochemical deposition to an environment suitable for electrochemical planarization; e.g., by changing the solution and the bias applied to the wafer. In this case, a single polishing station may be used to both deposit material and remove material from the wafer.

After conductive material has been either deposited or removed from the wafer surface, the wafer is transferred to the buff station 116 to further polish the surface of the wafer. After the polishing and/or buff process, the wafer is transferred to the stage 118 which is configured to maintain one or more wafers in a wet (e.g. deionized water) environment.

After the wafer is placed in the stage 118, the robot 138 picks up the wafer and transports it to the clean system 104. In particular, the robot 138 transports the wafer to the robot 130, which in turn places the wafer in one of the clean stations 124, 126. The wafer is cleaned using one or more of the stations 124 and 126 and then is transported to the spin rinse dryer 128 to rinse and dry the wafer prior to transporting it to the load/unload station 106 using the robot 136.

Figure 4:
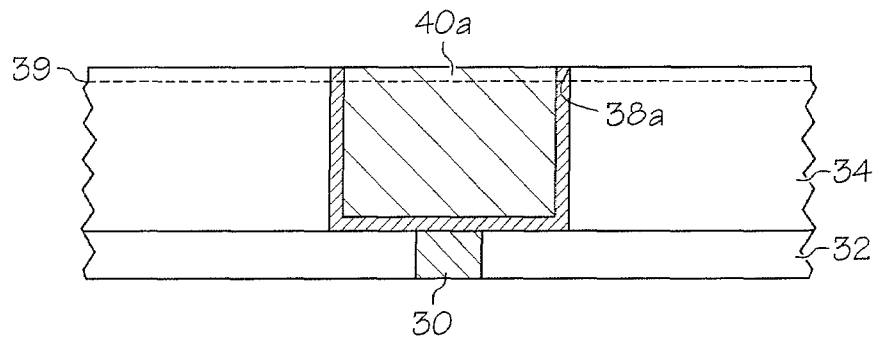

Returning to FIG. 3, an exemplary embodiment of the invention involves a method that includes the steps of depositing the copper layers 40a-d onto the barrier metal 38a-d, and planarizing the copper using a combined planar plating process and an abrasive-free polishing process to produce a structure containing barrier metal 38a-d on the dielectric material field, and very planar copper in the features such as the trench line or via 35 and also overlying the dielectric material 34. Following a below-described simplified barrier removal step that does not require a conventional capping layer or any polishing of the dielectric material 34, a very planar overall layer is prepared including the dielectric material 34 and the embedded copper layer 40a as illustrated in FIG. 4. Planar plating is a technique that includes electroplating copper onto a seed layer to fill features such as the trench line or via 35 in a bottom-up manner. Planar plating provides a thin and very planar exposed overburden of copper in the range of less than about 3000 Å. The planar plating process involves creating feature filling contrast by rubbing a wafer surface with a polishing pad before and/or during plating.

Figure 6:
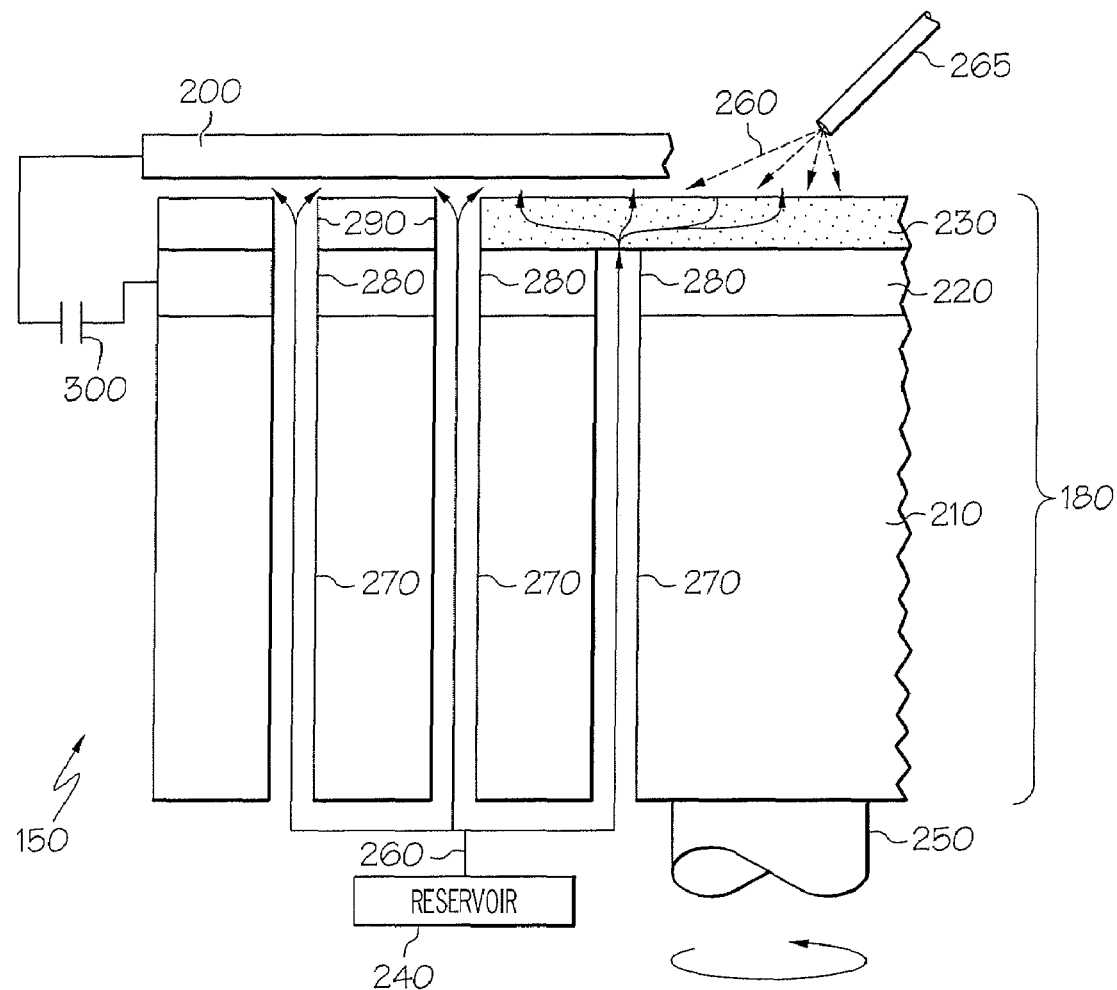
FIG. 6 is a cross-sectional view of a portion of an electrochemical deposition and polishing apparatus in accordance with an exemplary embodiment of the present invention.

In accordance with one embodiment of the invention, an apparatus 150 shown in FIG. 6 is configured to perform electrochemical deposition, electrochemical planarization, and/or polishing, utilizing a platen/polishing pad stack 180 that can also be utilized or easily modified for use with conventional apparatuses such as the above described apparatus 100 and the various associated components. The apparatus 150 includes the stack 180, a wafer 200 carried by a carrier assembly (not shown), a source of potential 300, a source of temperature controlled electrolytic solution 240, and drive controller 250. In general, the apparatus 150 is configured to electrochemically deposit onto or remove material from a surface of the wafer 200. The apparatus 150 is further configured to polish the wafer 200.

A conductive material 220 is disposed within the stack 180 which also includes a platen 210 and a polishing pad 230. During a deposition process, the conductive material 220 is coupled to the anode of a source of the supply voltage 300, and a second conductive material (not shown) is coupled to the wafer 200. By reversing the polarity, the process becomes an electro-polishing process.

There are several ways to introduce an electrolyte solution 260 to the interface between the polishing pad 230 and the wafer 200. Three exemplary methods are illustrated in FIG. 6, although only one method would typically be utilized for a given apparatus, and the three methods are illustrated merely for illustration. In one exemplary embodiment, the platen 210, conductive material 220, and polishing pad 230 have openings 270, 280, 290 therethrough to enable delivery of electrolyte solution 260 from the reservoir 240 through the polishing pad to reach the interface between the polishing pad 230 and the wafer 200. In another exemplary embodiment, the openings 270 and 280 lead the electrolyte solution 260 to the polishing pad that is formed from a porous material that absorbs the electrolyte solution 260 and allows the electrolyte 260 to seep out to the interface between the polishing pad 230 and the wafer 200. In yet another embodiment, the electrolyte 260 is poured onto the polishing pad 230 through a faucet 265.

As stated previously, electrochemical deposition results when the required potential difference is applied between the wafer 200 and the conductive material 220. Since the electrolyte solution is being provided to the region between the polishing pad 230 and the wafer 200, copper is electrochemically deposited on the wafer 200. Of course, it should be understood that a thin seed layer of copper must first be deposited on the wafer 200. This may be accomplished by forming a seed layer of copper on the surface of the wafer 200 as, for example, by sputtering, chemical vapor deposition, or any other suitable deposition methods. In particular, the power supply 300 applies a relative positive charge to conductive material 220 and a relative negative charge to the wafer 200.

The platen assembly having the polishing pad 230 disposed thereon is generally configured to move relative to the wafer 200 to facilitate wafer polishing and to promote a uniform deposition of material onto the wafer 200. The platen assembly may be connected to a drive motor assembly 250 that is operative to rotate the platen and polishing surface about a vertical axis. It will be appreciated, however, that the drive or motor assembly may be operative to move the platen assembly and polishing surface in an orbital, linear, rotational, or oscillatory pattern or any combination thereof. For example, U.S. Pat. No. 5,582,534 (Sheldon et al.) and U.S. Pat. No. 5,938,884 (Hoshizaki et al.) disclose several mechanisms for creating an orbital motion.

The electrolytic solution contained in the reservoir 240 includes the suitable precursors to the material being deposited onto the wafer surface. If the metallization layers include or consist of copper, a variety of copper salts may be employed in the electrolytic solution as a source of copper ions including, for example, copper sulfates, copper acetates, copper fluoroborate, and cupric nitrates. The copper salts may be suitably present in a relatively wide concentration range. Preferably, a copper salt will be employed at a concentration of from about 10 to about 300 grams/liter of composition.

The electrolyte solution typically includes suppressants, and accelerators as necessary. In an exemplary embodiment, the accelerant is included in the electrolyte solution with the copper salts. In another exemplary embodiment, the barrier metal surface is first activated with an accelerant and the accelerant is selectively removed from some of the exposed surface area to yield a plating rate contrast. The accelerator may be formulated for preferential adsorption within the features of the work piece, particularly within the narrow, high aspect ratio features. The accelerator may also be formulated so that it lowers the energy barrier required to cause deposition of the copper on the wafer surface. The accelerator may serve as a complexing agent that forms stable complexes with the copper. While copper may deposit on the work piece at a standard reduction potential, the copper may form a complex with the accelerator and have a reduction potential less than the standard reduction potential. Thus, less electricity would be required during the electrodeposition process to break the bonds of the accelerator/copper complex and deposit the copper onto the work piece. Alternatively, an accelerator may be selected so that an accelerator/copper complex is formed requiring a particular reduction potential. Depending on the value of this reduction potential, the amount and length of current supplied to the electrodeposition process can be varied so that the copper is deposited in varying grain size. In one exemplary embodiment of the invention, the accelerators include compounds that contain one or more sulfur atoms and have a molecular weight of about 1000 or less. For such an embodiment, the accelerators preferably include compounds having an —S—S— moiety, or compounds having the formula H—S—R, wherein R is an electron-donating group that increases electron density on the sulfur atom and impart stability to the accelerator anion that is created in solution. Co-pending U.S. application Ser. No. 10/666,432, filed Sep. 18, 2003 and entitled "Methods for Depositing Copper on a Noble Metal Layer of a Work Piece" is incorporated herein by reference and discloses specific accelerators as well as suppressants and other agents that may be utilized in the planar plating process in accordance with the present invention.

The planar plating process is performed until the structure appears as depicted in FIG. 3, with the copper layer 40a filling the trench line or via 35 over the barrier metal 38a and also overlying the barrier metal 38a in areas that are directly over the dielectric material 34. The copper layer 40a overlying the barrier metal 38a is effectively planarized to be between about 500 Å and about 3000 Å. At this point, the planar plating process ends and both the copper layer 38a and the barrier metal are together removed using a CMP process that includes the use of an AFP solution until the structure appears as depicted in FIG. 4. The AFP step is stopped when the planar dielectric material 34 surrounding the trench line or via 35 is exposed but before the planar dielectric material 34 is subjected to any polishing.

The abrasive-free polishing solution is an aqueous solution, and is preferably a basic solution such as a KOH solution. The solution oxidizes the copper metallization layer 40a and the barrier metal 38a to provide a corroded metal surface that is easily removed using a polishing pad. The absence of abrasive particles in the solution allows the metallization layer 40a and the barrier metal 38a to be removed without being scratched or unevenly polished due to abrasive build up.

After the process described above with reference to FIGS. 2 to 4 is completed, a planar surface is provided on which additional dielectric material 36a is deposited, etched to form a trench line or via that is above and continuous with via 35, and filled with a barrier metal 38b and a metallization layer 40b. The process is then repeated to form additional layers as illustrated in FIG. 1, without ever planarizing the dielectric material.

The process described above with reference to FIGS. 2 to 4 is both unique and particularly beneficial when the damascene structure includes a low dielectric material forming some or all of the dielectric layers 34, 36a-c. Dielectric materials having a dielectric constant less than about 2.6 are fragile and porous, and consequently do not withstand the mechanical and chemical stresses associated with polishing. The process of the present invention overcomes difficulties associated with low dielectric constant materials as the process enables production of stacked planar layers without any dielectric layer polishing. Discontinuous line 39 in FIG. 4 illustrates a depth for which overpolishing is performed in prior processes in order to correct for metal dishing. Some interconnect patterns or trench lines must be very deep, requiring a damascene process to be repeated for up to ten or more layers using conventional processes. Because the low dielectric constant material 34 is not polished according to the processes of the present invention, the number of layers for interconnect patterns or trench lines is substantially reduced. Another consequential benefit is a decrease in the total amount of metal wasted in overpolishing associated with each metallization line and better control of feature geometries.

Although the process described above enables stacked low dielectric constant layers to be formed without ever planarizing the low dielectric constant material, minor topographical imperfections may exist after a plurality of layers are formed. Typically some imperfections appear every two to four layers of low dielectric constant material. In order to avoid perpetuating the topographical perfections through the entire inter-layer dielectric stack, an exemplary embodiment of the invention includes the step of depositing a "planarization layer" as one layer such as layer 34 in FIGS. 1 to 4. The planarization layer is deposited every two to four layers of the inter-layer dielectric stack. The planarization layer is formed from a high mechanical strength dielectric material, and replaces one of the low dielectric constant material layers. Exemplary high mechanical strength dielectric layers have a dielectric constant higher than about 2.6 and include non-porous tetraethoxysilane (TEOS) films and SiC or SiOC films made from materials under the product names SiC or CORAL of Novellus Systems, Inc. The planarization layer is deposited using a conventional process and can be planarized using a CMP process. Because the planarization layer is only deposited every 2 to 4 layers, the overall inter-layer dielectric structure is predominantly formed from a low dielectric constant material and performs with improved low resistance in comparison with conventional inter-layer dielectric structures.

To minimize performance losses associated with the hard dielectric material, the planarization layer is formed in two steps according to one exemplary embodiment of the invention. First, only a portion of the planarization layer is deposited using a plasma enhanced chemical vapor deposition process, a spin coating process, or other conventional process suitable for forming a layer from a particular dielectric material, and the planarization layer is planarized using a CMP process. The planarization layer is preferably planarized to a thickness substantially equal to the height of the via that is to be etched later, although the layer can effectively be formed thinner or thicker than the via height. A layer of low dielectric constant material is then deposited on top of the hard layer up to the full height of the trench lines that are to be etched. The planarization layer and the low dielectric constant material are then simultaneously patterned and etched as a one-step dual damascene process without planarizing the low dielectric constant material. In an alternate embodiment, the process is performed in two sequential single damascene process steps. Either process enables the planarization layer to have a minimal thickness.

The above-described process overcomes some of the difficulties associated with forming an interlayer dielectric structure with multiple layers, including problems related to surface topography on a metallization or dielectric layer, and non-planar low dielectric constant materials. The process further overcomes problems associated with removing barrier metal that is disposed over a low dielectric constant material without requiring a conventional capping layer on the low dielectric constant material.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of forming a damascene structure on a substrate, the method comprising the steps of:

depositing a dielectric material over the substrate;

etching a pattern through the dielectric material to expose a portion of the substrate;

depositing a barrier metal over the dielectric material and the exposed portion of the substrate;

depositing a conductive metal over the barrier metal, the deposited conductive metal having a thickness sufficient to fill the etched pattern;

planarizing the conductive metal to form a planar metal layer over the barrier layer; and polishing the metal layer and the barrier metal in a single polishing step until the dielectric material surrounding the pattern is exposed.

2. The method according to claim 1, wherein the step of polishing the metal layer and the barrier layer is stopped before the dielectric material is polished.

3. The method according to claim 1, wherein the conductive metal is copper.

4. The method according to claim 1, wherein the dielectric material has a dielectric constant of less than about 2.6 .

5. The method according to claim 1, wherein the steps of depositing and planarizing the conductive metal are performed simultaneously using a process comprising the steps of:

electroplating the conductive metal onto an exposed workpiece surface by application of a predetermined current density to the workpiece; and rubbing the exposed workpiece surface with a polishing pad during at least the electroplating step.

6. The method according to claim 5, wherein the electroplating step comprises applying the predetermined current density while exposing the exposed workpiece to an electrodeposition composition comprising a metal salt, a suppressor, and an electrolyte.

7. The method according to claim 6, wherein the electrodeposition composition further comprises an accelerator.

8. The method according to claim 6, further comprising the step of exposing selected portions of the exposed workpiece to an accelerator before the electroplating step.

9. The method according to claim 1, wherein the planarization step comprises planarizing the conductive metal layer until the planar metal has a thickness ranging up to about 3000 Å.

10. The method according to claim 1, wherein the polishing step is performed using an abrasive-free polish.

* * * * *